United States Patent
Uehara (10) Patent No.: US 6,850,860 B2
(45) Date of Patent: Feb. 1, 2005

(54) SEMICONDUCTOR DEVICE TESTING APPARATUS AND TEST METHOD THEREFOR

(75) Inventor: Saburo Uehara, Tokyo (JP)

(73) Assignee: Advantest Corporation, Tokyo (JP)

( * ) Notice: Subject to any disclaimer, the term of this patent is extended or adjusted under 35 U.S.C. 154(b) by 37 days.

(21) Appl. No.: 09/805,811

(22) Filed: Mar. 13, 2001

(65) Prior Publication Data

US 2001/0033182 A1 Oct. 25, 2001

(30) Foreign Application Priority Data

Apr. 14, 2000 (JP) .......................................... 2000-113071

(51) Int. Cl.⁷ .............................................. G01R 31/00
(52) U.S. Cl. ........................................ 702/117; 324/765
(58) Field of Search .............................. 702/117, 118, 702/123, 189, 193; 324/763, 765

(56) References Cited

U.S. PATENT DOCUMENTS

| | | | | |
|---|---|---|---|---|
| 3,780,274 A | * | 12/1973 | Thompson et al. | 341/126 |
| 4,785,235 A | * | 11/1988 | Hendricks et al. | 324/73.1 |
| 5,894,226 A | | 4/1999 | Koyama | 324/765 |
| 5,978,573 A | * | 11/1999 | Ohara | 257/299 |
| 6,014,033 A | | 1/2000 | Fitzgerald et al. | 324/765 |
| 6,157,935 A | * | 12/2000 | Tran et al. | 382/187 |
| 6,282,680 B1 | * | 8/2001 | Takagi et al. | 714/724 |
| 6,320,400 B1 | * | 11/2001 | Black et al. | 324/765 |

FOREIGN PATENT DOCUMENTS

| | | |
|---|---|---|
| JP | 4-363675 | 12/1992 |
| JP | 9-152464 | 6/1997 |
| JP | 2760334 | 3/1998 |
| JP | 10-160798 | 6/1998 |

* cited by examiner

*Primary Examiner*—Marc S. Hoff
*Assistant Examiner*—Mary Catherine Baran
(74) *Attorney, Agent, or Firm*—Dellett & Walters (57) ABSTRACT

In a semiconductor device testing apparatus and test method, after a pass value and fail value corresponding respectively to an upper limit and a lower limit of a test range have been set, measurement is not performed at these positions, but measurement is performed by means of a binary search method from the next position.

3 Claims, 5 Drawing Sheets

SEMICONDUCTOR DEVICE TESTING APPARATUS AND TEST METHOD THEREFOR

BACKGROUND OF THE INVENTION

The present invention relates to a semiconductor device testing apparatus and test method for cases where an AC test, etc., is conducted on a semiconductor device using a binary search method.

A semiconductor testing apparatus has long been known as an apparatus for conducting tests on various kinds of semiconductor devices such as pre-shipment logic ICs and semiconductor memories. Tests conducted by this semiconductor testing apparatus include a function test, AC parametric test, and DC parametric test. Of these, the AC parametric test evaluates AC parameters such as time-axis characteristics and frequency characteristics of a semiconductor device which is the DUT (Device Under Test), and a method called a binary search is known as a typical test method.

Figure 5:
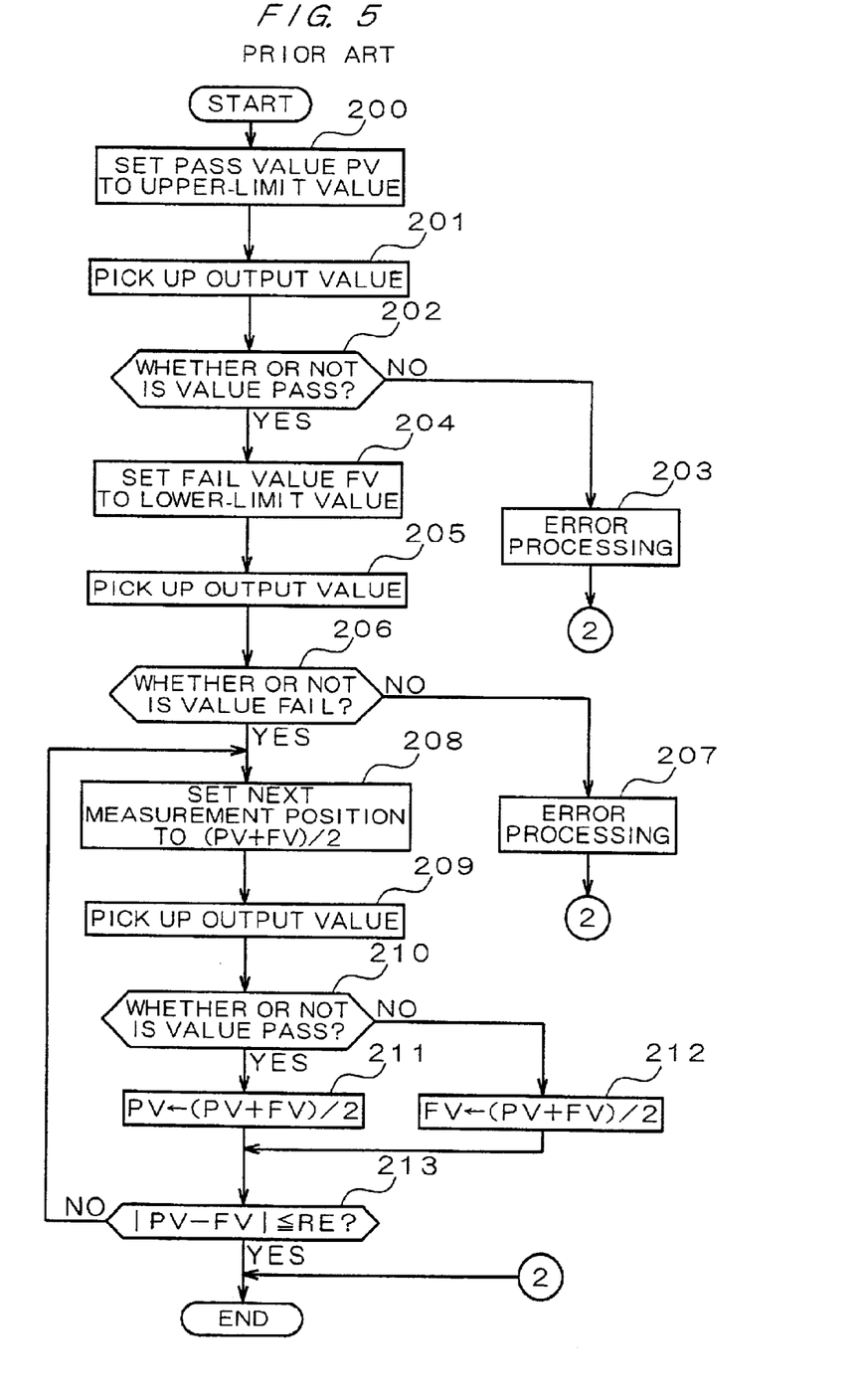
FIG. 5 is a flowchart showing a conventional processing procedure for finding a pass/fail threshold value of a semiconductor device using the binary search method.

FIG. 5 is a flowchart showing the conventional processing procedure for finding the pass/fail threshold value of a semiconductor device using the binary search method. As an example, the case will be considered where, for a normal semiconductor device, a pass is obtained as the measurement result when the measurement point is set to the upper-limit value of the test range, and a fail is obtained as the measurement result when the measurement point is set to the lower-limit value of the test range, and the pass/fail threshold value is searched for between these upper-limit and lower-limit values.

(1) First, the pass value PV is set to the upper-limit value of the test range (step 200), the output value of the Device Under Test at the measurement position corresponding to this pass value is examined (step 201), and a pass is confirmed (step 202). If the Device Under Test does not pass, the prescribed error processing is performed (step 203).

(2) Similarly, the fail value FV is set to the lower-limit value of the test range (step 204), the output value of the Device Under Test at the measurement position corresponding to this fail value is examined (step 205), and a fail is confirmed (step 206). If the Device Under Test does not fail, the prescribed error processing is performed (step 207).

(3) The next measurement point is set to (PV+FV)/2, (step 208), the output value of the Device Under Test at this measurement position is examined (step 209), and a check is made of whether the Device Under Test has passed or failed (step 210). If the measurement result is a pass, the current measurement position (PV+FV)/2 is assigned to the pass value PV (step 211). If, on the other hand, the measurement result is a fail, the current measurement position (PV+FV)/2 is assigned to the fail value FV (step 212).

(4) The processing described in (3) above is repeated until the absolute value of the difference between the pass value PV and the fail value FV, |PV−FV|, is equal to or less than the resolution RE (step 213).

Now, according to the conventional method using the binary search method, measurements at the upper-limit value and lower-limit value of the test range are performed in order to confirm that the Device Under Test is normal, and there is little possibility of the pass/fail threshold value lying outside this test range. With the actual values obtained in actual testing, the proportion of cases in which a fail is at the upper limit of the test range, or a pass is at the lower limit of the test range, is several percent. Therefore, with the conventional method using the binary search method, there is a problem of a long testing time due to the execution of inefficient confirmation work in which results that are a matter of course are obtained. When a large number of Devices Under Test are tested consecutively, in particular, the individual test times accumulate, and a method is therefore desirable that will allow at least somewhat more efficient testing to be carried out, and the overall test time to be shortened.

SUMMARY OF THE INVENTION

The present invention has been achieved by taking into account the points described above, and it is an object of the present invention to provide a semiconductor device testing apparatus and test method that enable the test time to be shortened.

At the time of detecting the pass/fail threshold within a prescribed test range for a semiconductor device based on the binary search method, the semiconductor device testing apparatus of the present invention sets either the upper-limit value or the lower-limit value of the test range as the pass value, and the other limit value as the fail value, by means of initial value setting unit, and performs measurement by means of the binary search method for the semiconductor device with these pass and fail values by means of device measuring unit. As the test range is normally set so that a pass is observed at either the upper-limit value or the lower-limit value, and a fail is observed at the other limit value, there is little possibility of an error occurring at these upper-limit and lower-limit values. It is therefore possible to perform efficient testing and to shorten the test time by not performing measurement at these limits but performing measurement by means of the binary search method from the next position.

It is desirable, in particular, for at least one or other of the pass value and fail value set by means of the above described initial value setting unit to be changed by means of initial value changing unit so that the test range is extended by an amount equivalent to a prescribed value. With the binary search method, the intermediate value between the previous pass value and fail value is calculated and pass value or fail value updating is performed, and therefore as long as this calculation is performed, it is not possible to perform pass/fail judgment at the measurement position corresponding to one or other of the upper-limit value and lower-limit value of the test range. This problem can be avoided by increasing the initial test range by an amount equivalent to a prescribed value.

Also, it is desirable for this prescribed value to be equivalent to the measurement resolution. In order to avoid the above described problem, it is sufficient to extend the test range by an amount equivalent to the resolution, and by extending the test range by the minimum necessary amount in this way, it is possible to prevent the test time from becoming unnecessarily long.

Moreover, with the semiconductor device test method of the present invention, processing consisting of first to fifth steps shown below is performed in order to detect the pass/fail threshold within a prescribed test range for a semiconductor device based on the binary search method. In the first step, either the upper-limit value or the lower-limit value of the test range is set as the pass value, and the other limit value is set as the fail value. In the second step, the measurement position is set in accordance with the binary search method, using the pass value and fail value. In the third step, the prescribed measurement is performed on the semiconductor device at the measurement position set in the second step. In the fourth step, if the measurement result obtained in the third step is a pass, the measurement position set in the second step is set as the pass value, or if this measurement result is a fail, the measurement position set in the second step is set as the fail value. In the fifth step, after the processing in the fourth step is completed, the difference between the pass value and the fail value is calculated, and a command is given to repeat the processing from the second step onward until this difference is equal to or less than the measurement resolution. By omitting pass/fail judgment at the measurement positions corresponding to the upper-limit value and lower-limit value of the measurement range, pass/fail judgment at the measurement position corresponding to the intermediate value between these two is performed, enabling efficient testing to be performed and making it possible to shorten the test time.

Also, in the above described first step, it is desirable for the test range to be extended by an amount equivalent to a prescribed value, and for a pass value and fail value corresponding to the upper-limit value and lower-limit value of that range to be set. By extending the test range it is possible, at the time of calculating the next measurement position using the binary search method, to avoid the problem whereby the upper-limit value or lower-limit value of the test range prior to extending the range is no longer set as the measurement position.

DESCRIPTION OF THE PREFERRED EMBODIMENT

With reference now to the attached drawings, an embodiment of a semiconductor device testing apparatus to which the present invention is applied will be described in detail below.

Figure 1:
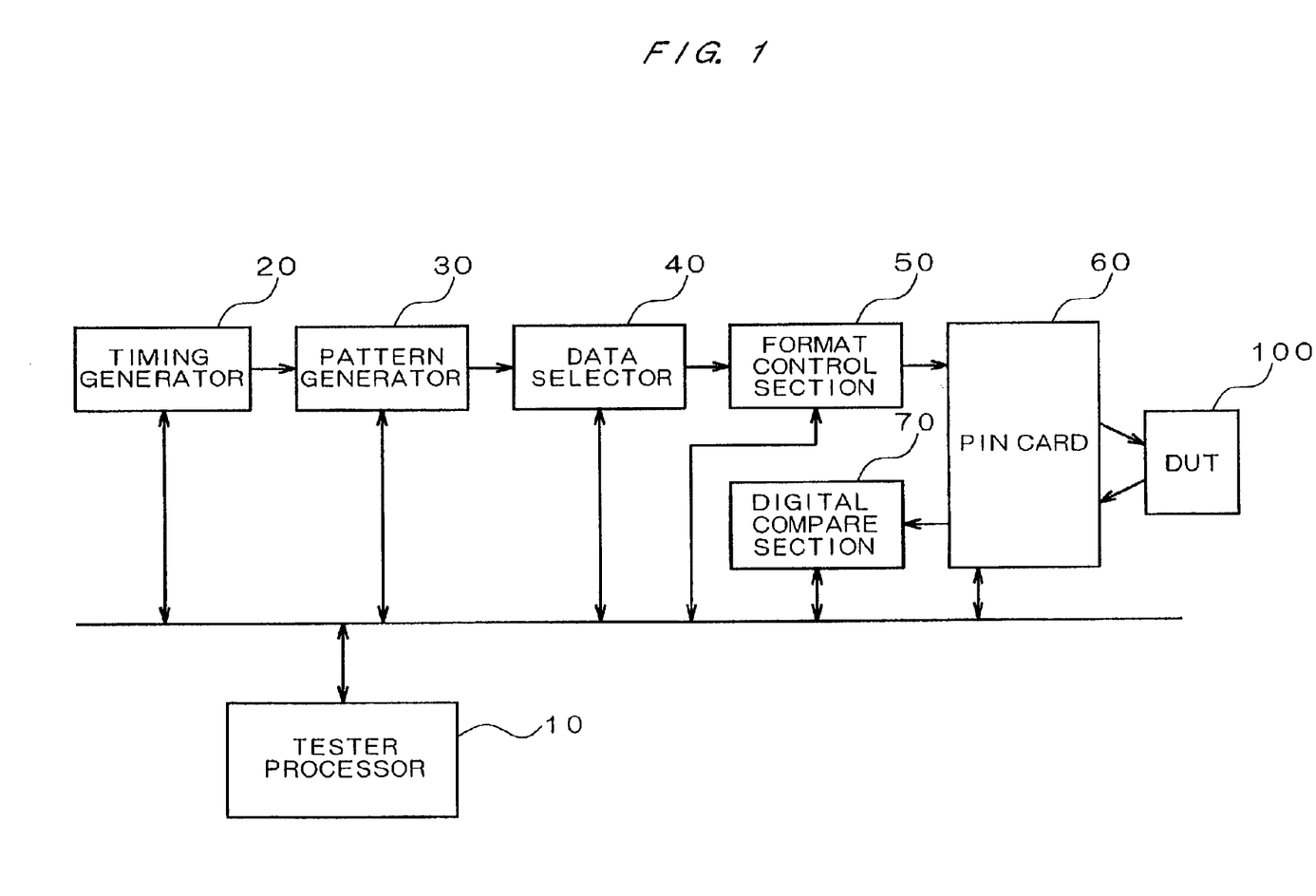
FIG. 1 is a drawing showing a configuration of a semiconductor device testing apparatus of one embodiment.

FIG. 1 is a drawing showing a configuration of a semiconductor device testing apparatus of one embodiment. The semiconductor device testing apparatus shown in this drawing is an apparatus for conducting an AC parametric test, DC parametric test, function test, etc., on a DUT (Device Under Test) 100, and in order to perform input/output of various signals necessary for testing to/from the DUT 100, is configured by a tester processor 10, a timing generator 20, a pattern generator 30, a data selector 40, a format control section 50, a pin card 60, and a digital compare section 70.

The above described tester processor 10 executes a prescribed test program by means of an operating system (OS) and controls the overall semiconductor device testing apparatus in order to conduct an AC parametric test, etc., on the DUT 100.

The timing generator 20 sets the basic cycle necessary for testing and also generates various timing edges within this set basic cycle. The pattern generator 30 generates pattern data that is input to pins including the clock pin of the DUT 100. The data selector 40 establishes a correspondence between various kinds of pattern data output from the pattern generator 30 and the pins of the DUT 100 to which this data is input. The format control section 50 performs waveform control for the DUT 100 based on pattern data generated by the pattern generator 30 and selected by the data selector 40, and timing edges generated by the timing generator 20.

The pin card 60 is used to provide a physical interface between the format control section 50 and digital compare section 70, and the DUT 100. The pin card 60 is configured by a driver that applies a prescribed pattern waveform to a corresponding pin of the DUT 100; a dual comparator that simultaneously performs comparison between the voltage waveform appearing at a pin, and a prescribed low-level voltage and high-level voltage; a programmable load that allows an arbitrary load current value to be set; and a terminal resistance that has a prescribed resistance value (for example, 50 Ω) connected to the pins. Among the pins of the DUT 100 are some, such as pins corresponding to address pins, to which only prescribed data is input. Such pins do not require the above described dual comparator, programmable load, or terminal resistance, and only the driver is connected to them.

The digital compare section 70 compares expected value data for each pin selected by the data selector 40 with the output of each pin of the DUT 100. The timing for performing this comparison is specified by the timing edge STRB of the strobe signal generated by the timing generator 20.

The above described tester processor 10 corresponds to the initial value setting unit and initial value changing unit, while the tester processor 10, timing generator 20, pattern generator 30, data selector 40, format control section 50, pin card 60, and digital compare section 70 correspond to the device measuring unit.

The present embodiment of a semiconductor device testing apparatus has this kind of configuration, and the operation when it is used to conduct an AC parametric test on the DUT 100 by means of the binary search method will now be described.

Figure 2:
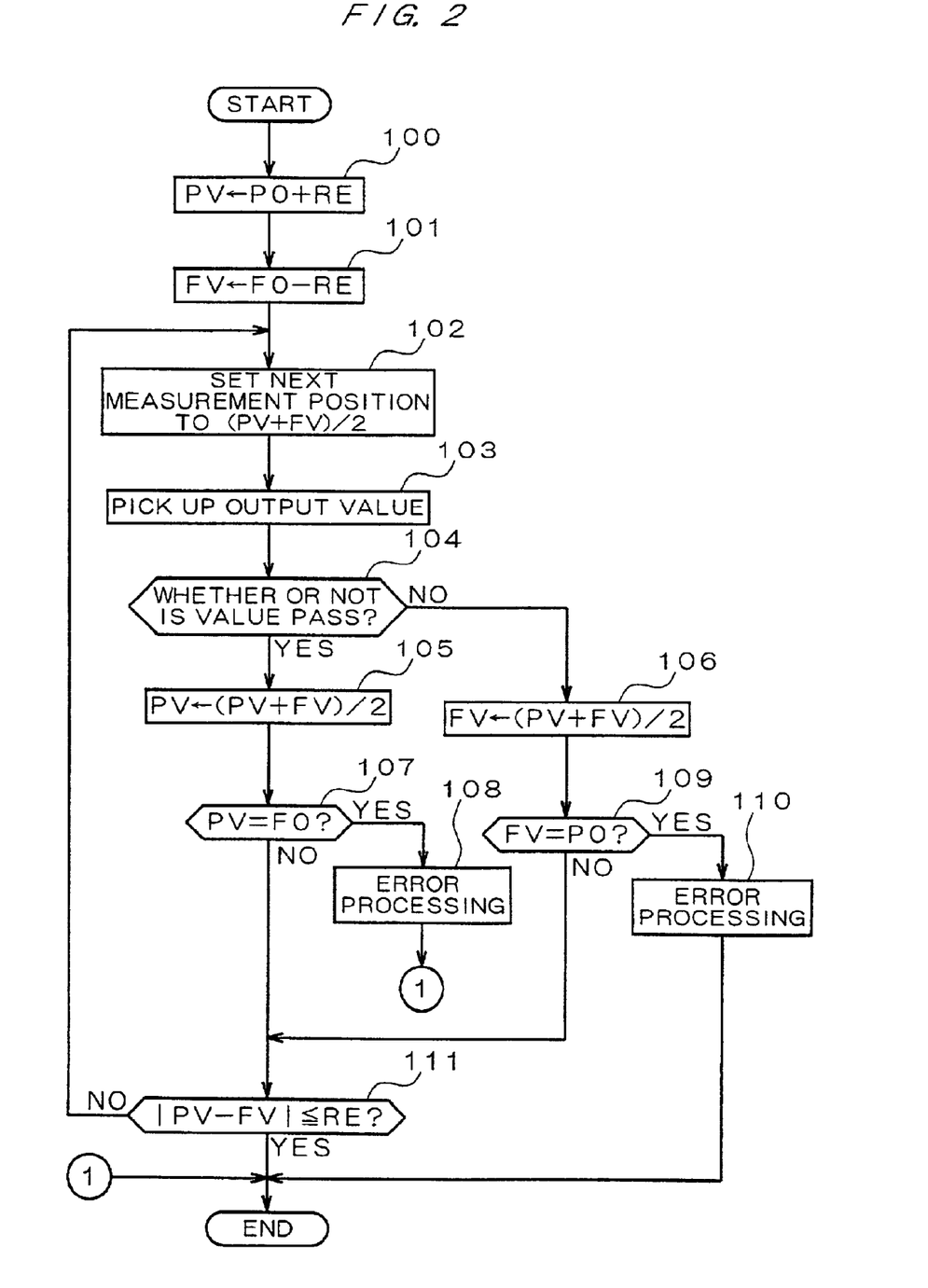
FIG. 2 is a drawing showing an operating procedure in an AC parametric test of a semiconductor device testing apparatus of the present embodiment.

FIG. 2 is a drawing showing the operating procedure in an AC parametric test of the present embodiment of a semiconductor device testing apparatus. For example, the operating procedure for detecting the pass/fail threshold value in a prescribed test range using the binary search method is shown.

(1) First, the tester processor 10 sets the value (P0+RE), obtained by adding the resolution RE to the upper-limit value P0 of the test range, as the pass value PV in the initial state (step 100).

(2) In addition, the tester processor 10 sets the value (F0—RE), obtained by subtracting the resolution RE from the lower-limit value F0 of the test range, as the fail value FV in the initial state (step 101).

(3) Next, the tester processor 10 sets the measurement position to (PV+FV)/2 (step 102), examines the output value of the observed pin of the DUT 100 at this measurement position (step 103), and checks for pass or fail (step 104). To be specific, the prescribed test pattern waveform is input to the observed pin of the DUT 100 by sending a command from the tester processor 10 to the timing generator 20, pattern generator 30, data selector 40, and format control section 50. In parallel with the operation for inputting this test pattern waveform, a strobe signal STRB with a timing corresponding to the above described measurement position (PV+FV)/2 is generated by sending a command from the tester processor 10 to the timing generator 20, and pass/fail judgment is performed for the output value by the digital compare section 70.

If the output result is a pass, the tester processor 10 sets the current measurement position (PV+FV)/2 as the pass value PV (step 105). If, on the other hand, the output result is a fail, the tester processor 10 sets the current measurement position (PV+FV)/2 as the fail value FV (step 106).

(4) In addition, if the measurement result at the measurement position corresponding to the lower-limit value F0 of the test range before extending the range is a pass (step 107), the tester processor 10 makes an error judgment and shifts to the prescribed error processing (step 108). Similarly, if the measurement result at the measurement position corresponding to the upper-limit value P0 of the test range is a fail (step 109), the tester processor 10 makes an error judgment and shifts to the prescribed error processing (step 110).

(5) Next, the tester processor 10 judges whether the absolute value of the difference between the pass value PV and the fail value FV, |PV−FV|, is equal to or less than the resolution RE, and repeats the measurement operations from step 102 onward until the absolute value |PV−FV| is equal to or less than the resolution RE (step 111).

Thus, with the present embodiment of a semiconductor device testing apparatus, AC parametric testing using the binary search method is performed on the DUT 100 with measurement at the upper-limit value and lower-limit value of the test range omitted, and by not performing inefficient measurements at these measurement points it becomes possible to shorten the test time. Also, since measurements are not performed initially at the upper-limit value and lower-limit value of the test range, there are cases in which error checking is not possible at these measurement points, but with the present embodiment the test range is extended by an amount equivalent to one resolution both upward and downward, and therefore error checks can be made at these points.

Actual Investigation of Number of Measurements

Next, to what extent the number of measurements can be reduced by using the method of the present embodiment will be investigated.

FIGS. 3A through 3G are explanatory drawings showing the results of investigating the number of measurements when the output waveform of the DUT 100 varies with respect to a prescribed test range. As an example, all patterns of the output waveform of the DUT 100 will be considered, assuming that the test range prior to extension is a through f. Reference characters a, b, . . . denote positions for which there is a possibility of being set as a measurement position, and the minimum value of the interval between these is the resolution RE. The numerals below measurement positions a, b, . . . show the order of measurement, and below these numerals reference character P indicates that the measurement result for that measurement point is a pass and reference character F indicates that the measurement result for that measurement point is a fail.

Figure 3A:
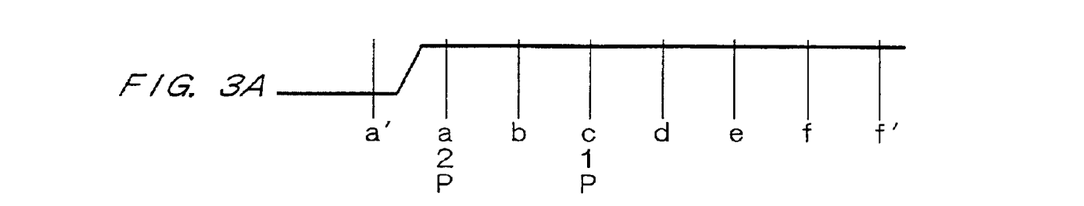
FIGS. 3A through 3G are explanatory drawings showing results of investigating the number of measurements when the output waveform of the Device Under Test varies with respect to a prescribed test range.

In FIG. 3A, the test results are shown for the case where the output waveform of the DUT 100 rises ahead of the lower-limit value of the original test range (measurement position a). In this case, an error judgment is made at the point in time at which the measurement at measurement position a ends and a pass judgment is made as the measurement result, and therefore the number of measurements is two.

Figures 3B, 3C, 3D:
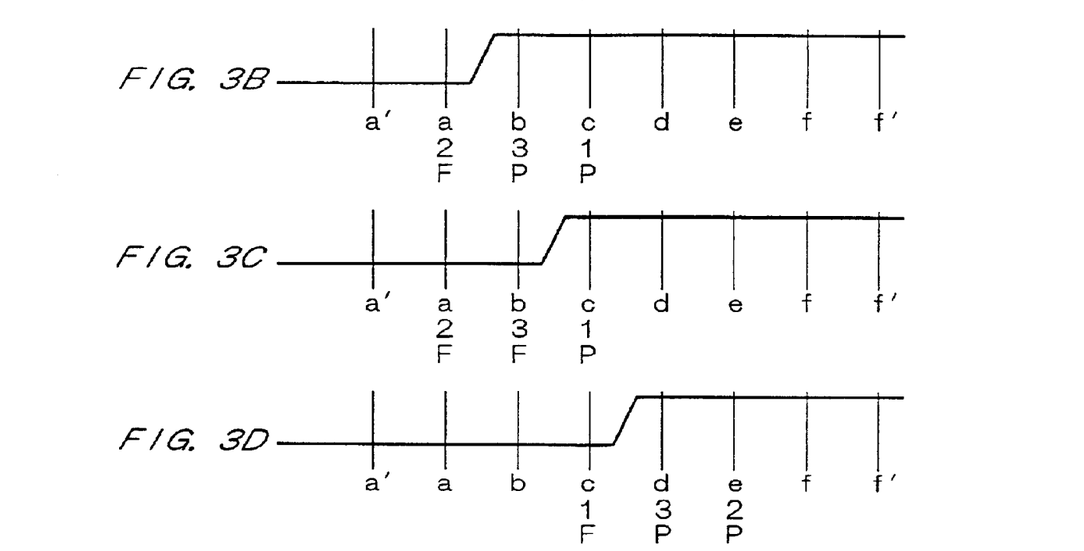

In FIG. 3B, the test results are shown for the case where the output waveform of the DUT 100 rises between measurement positions a and b. In this case, at the point in time at which the measurement at measurement position b ends and a pass judgment is made as the measurement result, the absolute value of the difference between the pass value PV and the fail value FV is equal to the resolution RE, and the pass/fail threshold is judged to be between measurement positions a and b. Therefore, the number of measurements is three.

In FIG. 3C, the test results are shown for the case where the output waveform of the DUT 100 rises between measurement positions b and c. In this case, at the point in time at which the measurement at measurement position b ends and a fail judgment is made as the measurement result, the absolute value of the difference between the pass value PV and the fail value FV is equal to the resolution RE, and the pass/fail threshold is judged to be between measurement positions b and c. Therefore, the number of measurements is three.

In FIG. 3D, the test results are shown for the case where the output waveform of the DUT 100 rises between measurement positions c and d. In this case, at the point in time at which the measurement at measurement position d ends and a pass judgment is made as the measurement result, the absolute value of the difference between the pass value PV and the fail value FV is equal to the resolution RE, and the pass/fail threshold is judged to be between measurement positions c and d. Therefore, the number of measurements is three.

Figure 3E:
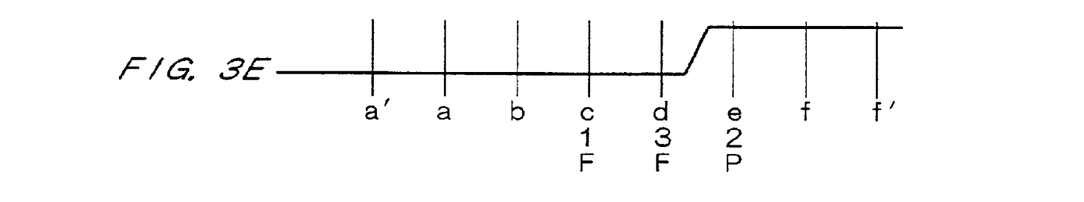

In FIG. 3E, the test results are shown for the case where the output waveform of the DUT 100 rises between measurement positions d and e. In this case, at the point in time at which the measurement at measurement position d ends and a fail judgment is made as the measurement result, the absolute value of the difference between the pass value PV and the fail value FV is equal to the resolution RE, and the pass/fail threshold is judged to be between measurement positions d and e. Therefore, the number of measurements is three.

Figure 3F:
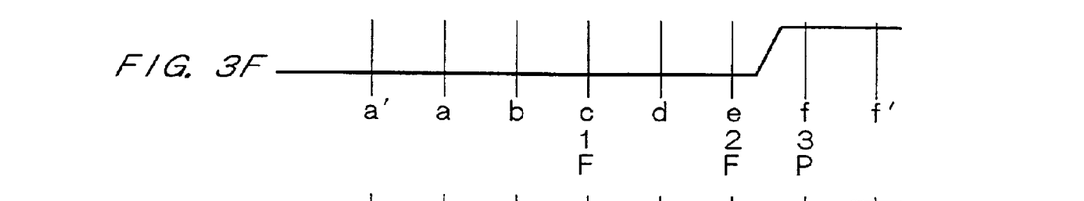

In FIG. 3F, the test results are shown for the case where the output waveform of the DUT 100 rises between measurement positions e and f. In this case, at the point in time at which the measurement at measurement position f ends and a pass judgment is made as the measurement result, the absolute value of the difference between the pass value PV and the fail value FV is equal to the resolution RE, and the pass/fail threshold is judged to be between measurement positions e and f. Therefore, the number of measurements is three.

Figure 3G:
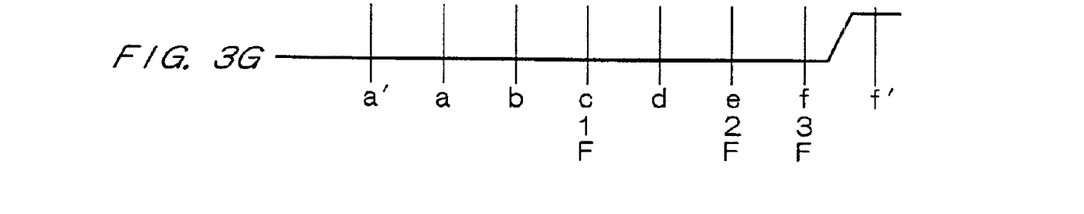

In FIG. 3G, the test results are shown for the case where the output waveform of the DUT 100 rises after the upper-limit value of the original test range (measurement position f). In this case, an error judgment is made at the point in time at which the measurement at measurement position f ends and a fail judgment is made as the measurement result, and therefore the number of measurements is three.

By using the method of the present embodiment, the overall number of measurements when all patterns appear uniform (the number obtained by totaling the number of measurements corresponding to each of FIG. 3A through FIG. 3G) is 2+3+3+3+3+3+3=20 measurements.

Also, as the probability of the appearance of the measurement patterns corresponding to FIG. 3A and FIG. 3G is actually low (in actual measurement, several percent), if the probability of the appearance of these patterns is assumed to be 10%, then calculating the overall number of measurements gives $(2+3) \times 10\% + (3+3+3+3+3) \times 90\% = 14.0$.

FIGS. 4A through 4G are explanatory drawings showing the measurement results with the conventional method using the binary search method. The measurement conditions, etc., are the same as in the cases shown in FIG. 3.

Figure 4A:
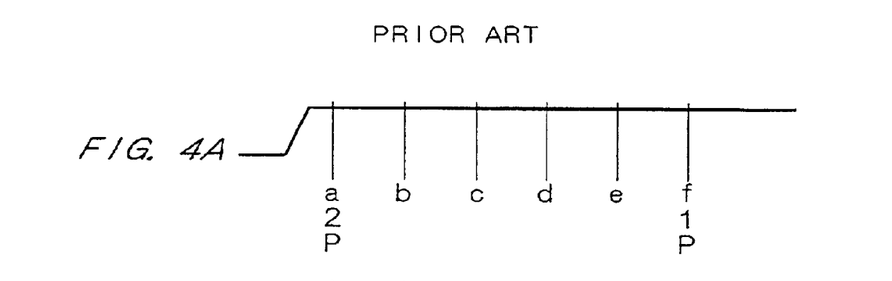
FIGS. 4A through 4G are explanatory drawings showing the measurement results with a conventional method using a binary search method.

In FIG. 4A, the test results are shown for the case where the output waveform of the DUT 100 rises ahead of the lower-limit value of the test range (measurement position a). In this case, an error judgment is made at the point in time at which the measurement at measurement position a ends and a pass judgment is made as the measurement result, and therefore the number of measurements is two.

Figure 4B:
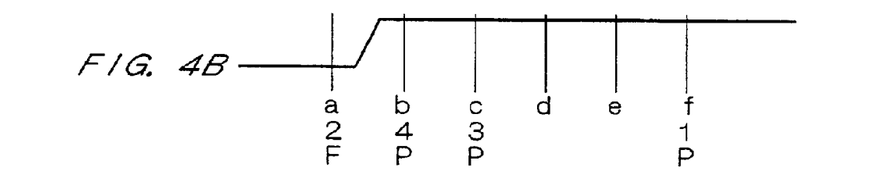

In FIG. 4B, the test results are shown for the case where the output waveform of the DUT 100 rises between measurement positions a and b. In this case, at the point in time at which the measurement at measurement position b ends and a pass judgment is made as the measurement result, the absolute value of the difference between the pass value PV and the fail value FV is equal to the resolution RE, and the pass/fail threshold is judged to be between measurement positions a and b. Therefore, the number of measurements is four.

Figure 4C:
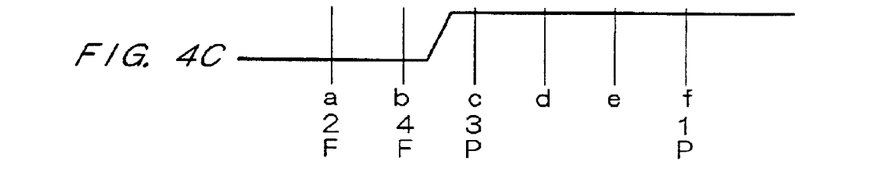

In FIG. 4C, the test results are shown for the case where the output waveform of the DUT 100 rises between measurement positions b and c. In this case, at the point in time at which the measurement at measurement position b ends and a fail judgment is made as the measurement result, the absolute value of the difference between the pass value PV and the fail value FV is equal to the resolution RE, and the pass/fail threshold is judged to be between measurement positions b and c. Therefore, the number of measurements is four.

Figures 4D, 4E:
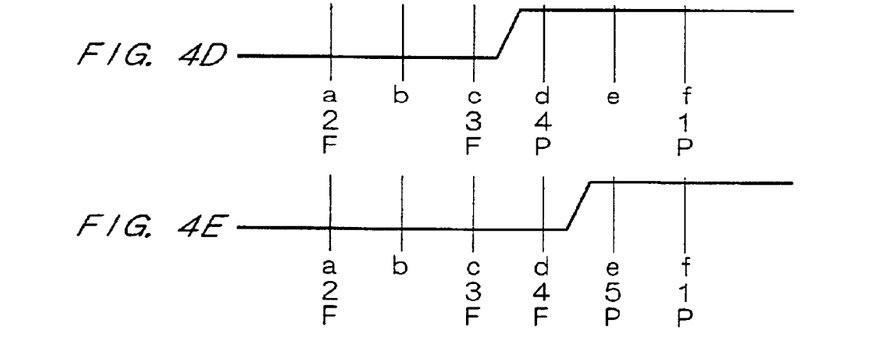

In FIG. 4D, the test results are shown for the case where the output waveform of the DUT 100 rises between measurement positions c and d. In this case, at the point in time at which the measurement at measurement position d ends and a pass judgment is made as the measurement result, the absolute value of the difference between the pass value PV and the fail value FV is equal to the resolution RE, and the pass/fail threshold is judged to be between measurement positions c and d. Therefore, the number of measurements is four.

In FIG. 4E, the test results are shown for the case where the output waveform of the DUT 100 rises between measurement positions d and e. In this case, at the point in time at which the measurement at measurement position e ends and a pass judgment is made as the measurement result, the absolute value of the difference between the pass value PV and the fail value FV is equal to the resolution RE, and the pass/fail threshold is judged to be between measurement positions d and e. Therefore, the number of measurements is five.

Figure 4F:
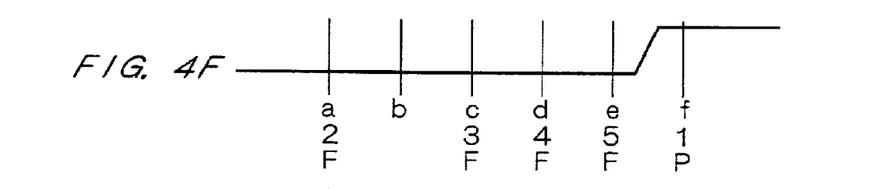

In FIG. 4F, the test results are shown for the case where the output waveform of the DUT 100 rises between measurement positions e and f. In this case, at the point in time at which the measurement at measurement position e ends and a pass judgment is made as the measurement result, the absolute value of the difference between the pass value PV and the fail value FV is equal to the resolution RE, and the pass/fail threshold is judged to be between measurement positions e and f. Therefore, the number of measurements is five.

Figure 4G:
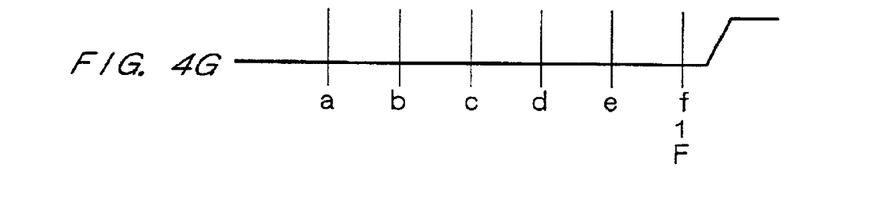

In FIG. 4G, the test results are shown for the case where the output waveform of the DUT 100 rises after the upper-limit value of the original test range (measurement position f). In this case, an error judgment is made at the point in time at which the measurement at measurement position f ends and a fail judgment is made as the measurement result, and therefore the number of measurements is one.

By using the conventional method, the overall number of measurements when all patterns appear uniform (the number obtained by totaling the number of measurements corresponding to each of FIG. 4A through FIG. 4G) is $2+4+4+4+5+5+1=25$ measurements.

Also, assuming the probability of the actual appearance of the measurement patterns corresponding to FIG. 4A and FIG. 4G to be 10%, calculating the overall number of measurements gives $(2+1) \times 10\% + (4+4+4+5+5) \times 90\% = 20.1$.

Thus, in cases where all the patterns appear uniform, the number of measurements is 20 when using the method of the present embodiment, and 25 when using the conventional method. Therefore, by using the method of the present embodiment, the number of measurements is decreased to 20/25=80%, and a 20% increase in efficiency can be achieved.

Also, when the probability of an error when performing measurement at the upper limit and lower limit of the test range is taken as 10%, the number of measurements is 14.0 using the method of the present embodiment and 20.1 when using the conventional method. Therefore, by using the method of the present embodiment, the number of measurements is decreased to 14.0/20.1=69%, and an increase in efficiency of approximately 30% can be achieved.

The present invention is not limited to the above described embodiment, and various modifications are possible without departing from the object of the present invention. For example, with the above described semiconductor device testing apparatus, the case has been described in which an AC parametric test is conducted using the binary search method, but the present invention can be applied to tests other than an AC parametric test as long as the binary search method is used.

Also, in the above described embodiment, the case has been described in which the output waveform of the observed pin of the DUT 100 rises in the test range, but the present invention can also be similarly applied in cases where this output waveform falls in the test range. In this case an error judgment is made when the measurement result at the lower limit of the test range (measurement position a) is a fail, or the measurement result at the upper limit of the test range (measurement position f) is a pass.

What is claimed is:

1. A semiconductor device testing apparatus that detects a pass/fail threshold within a prescribed test range for a semiconductor device based on a binary search method, comprising:

initial value setting unit for setting either an upper limit value or a lower limit value of said test range as a pass value and the other limit value as a fail value; and device measuring unit for performing measurement by means of the binary search method on said semiconductor device with the said set pass value and said set fail value, further comprising an initial value changing unit for changing at least one of said pass value and said fail value set by said initial value setting unit so that said test range is extended by an amount equivalent to a prescribed value, wherein said device measuring unit performs said measurement using said pass value and said fail value after the value has been changed by said initial value changing unit.

2. The semiconductor device testing apparatus according to claim 1, wherein said prescribed value is equivalent to a measurement resolution.

3. A semiconductor device test method for detecting a pass/fail threshold within a prescribed test range for a semiconductor device based on a binary search method, comprising:

a first step of setting either an upper-limit value or a lower-limit value of said test range as a pass value and the other limit value as a fail value;

a second step of setting a measurement position in accordance with the binary search method, using said pass value and said fail value;

the third step of performing a prescribed measurement on said semiconductor device at said measurement position set in said second step;

a fourth step of setting said pass value equal to the measurement position set in said second step if the measurement result obtained in said third step is a pass, or setting said fail value equal to the measurement position set in said second step if said measurement result is a fail; and a fifth step of calculating a difference between said pass value and said fail value after a processing in said fourth step is completed, and giving a command to repeat the processing from said second step onward until this difference is equal to or less than a measurement resolution, wherein said first step extends said test range by an amount equivalent to a prescribed value, and sets said pass value and said fail value corresponding to the upper limit value and lower limit value of the range.

* * * * *